United States Patent
Wang et al.

(10) Patent No.: US 12,334,319 B2
(45) Date of Patent: Jun. 17, 2025

(54) PHYSICAL VAPOR DEPOSITION (PVD) WITH TARGET EROSION PROFILE MONITORING

(71) Applicant: Taiwan Semiconductor Manufacturing Company, Ltd., Hsinchu (TW)

(72) Inventors: Chia-Hsi Wang, Changhua County (TW); Yen-Yu Chen, Taichung (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

(21) Appl. No.: 18/337,430

(22) Filed: Jun. 20, 2023

(65) Prior Publication Data
US 2024/0429036 A1  Dec. 26, 2024

(51) Int. Cl.
| | | |
|---|---|---|
| *C23C 14/34* | (2006.01) | |
| *C23C 14/54* | (2006.01) | |
| *H01J 37/34* | (2006.01) | |

(52) U.S. Cl.
CPC ...... *H01J 37/3479* (2013.01); *C23C 14/3407* (2013.01); *C23C 14/54* (2013.01); *H01J 37/3435* (2013.01); *H01J 2237/332* (2013.01)

(58) Field of Classification Search
CPC ............... H01J 37/3479; H01J 37/3435; H01J 2237/332; C23C 14/3407; C23C 14/54
USPC ............ 204/192.13, 192.12, 298.12, 298.13
See application file for complete search history.

(56) References Cited

U.S. PATENT DOCUMENTS

| | | | | |
|---|---|---|---|---|
| 2007/0017800 A1* | 1/2007 | Cetinkaya | ........... | H01J 37/3482 204/192.1 |
| 2012/0199469 A1* | 8/2012 | Rasheed | ............. | C23C 14/3407 204/192.1 |
| 2016/0376695 A1* | 12/2016 | Yang | ...................... | G01N 29/11 204/298.03 |

FOREIGN PATENT DOCUMENTS

| | | | |
|---|---|---|---|
| JP | 11-162851 | * | 6/1999 |
| WO | WO 2013005827 | * | 1/2013 |

OTHER PUBLICATIONS

Machine Translation of Yajima et al. JP 11-162851 (Year: 1999).*
Machine Translation WO 2013/005827 (Year: 2013).*

* cited by examiner

*Primary Examiner* — Rodney G McDonald
(74) *Attorney, Agent, or Firm* — KILPATRICK TOWNSEND & STOCKTON LLP

(57) ABSTRACT

A physical vapor deposition (PVD) system includes: a chamber body; a substrate support disposed within the chamber body and capable of supporting a substrate; a PVD target; and a target profile monitoring subsystem. The PVD target includes: a target plate comprising a target material; and a backing plate attached to the target plate and comprising: a central section; and a peripheral section circumferentially surrounding the central section in a horizontal plane. The peripheral section has a first thickness in a vertical direction, the central section has a second thickness in the vertical direction, and the first thickness is larger than the second thickness. The target profile monitoring subsystem is configured to monitor usage of the target plate.

20 Claims, 9 Drawing Sheets

900

Introduce a physical vapor deposition (PVD) target in a PVD system, the PVD target comprising a target plate comprising a target material and a backing plate attached to the target plate, the backing plate comprising a central section and a peripheral section circumferentially surrounding the central section in a horizontal plane, wherein the peripheral section has a first thickness in a vertical direction, the central section has a second thickness in the vertical direction, and the first thickness is larger than the second thickness

902

↓

Deposit the target material on a substrate

904

↓

Monitor usage of the target plate.

906

- Detect a DC voltage of the PVD system

912

- Obtain a DC voltage range curve based on the DC voltage of the PVD system

914

- Determine whether the DC voltage range curve is above a threshold value

916

↓

Stop the PVD system after determining that the DC voltage range curve is above the threshold value.

PHYSICAL VAPOR DEPOSITION (PVD) WITH TARGET EROSION PROFILE MONITORING

FIELD

Embodiments of the present disclosure relate generally to physical vapor deposition (PVD), and more particularly to PVD with target erosion profile monitoring.

BACKGROUND

The semiconductor industry has experienced rapid growth due to ongoing improvements in the integration density of a variety of electronic components (e.g., transistors, diodes, resistors, capacitors, etc.). For the most part, improvement in integration density has resulted from iterative reduction of minimum feature size, which allows more components to be integrated into a given area.

While some integrated device manufacturers (IDMs) design and manufacture integrated circuits (IC) themselves, fabless semiconductor companies outsource semiconductor fabrication to semiconductor fabrication plants or foundries. Semiconductor fabrication consists of a series of processes in which a device structure is manufactured by applying a series of layers onto a substrate. This involves the deposition and removal of various thin film layers. The areas of the thin film that are to be deposited or removed are controlled through photolithography. Each deposition and removal process is generally followed by cleaning as well as inspection steps. Therefore, both IDMs and foundries rely on numerous semiconductor equipment and semiconductor fabrication materials, often provided by vendors. There is always a need for customizing or improving those semiconductor equipment and semiconductor fabrication materials, which results in more flexibility, reliability, and cost-effectiveness.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 9 is a flowchart illustrating an example method for monitoring the erosion profile of a PVD target.

DETAILED DESCRIPTION OF THE INVENTION

Figure 1:
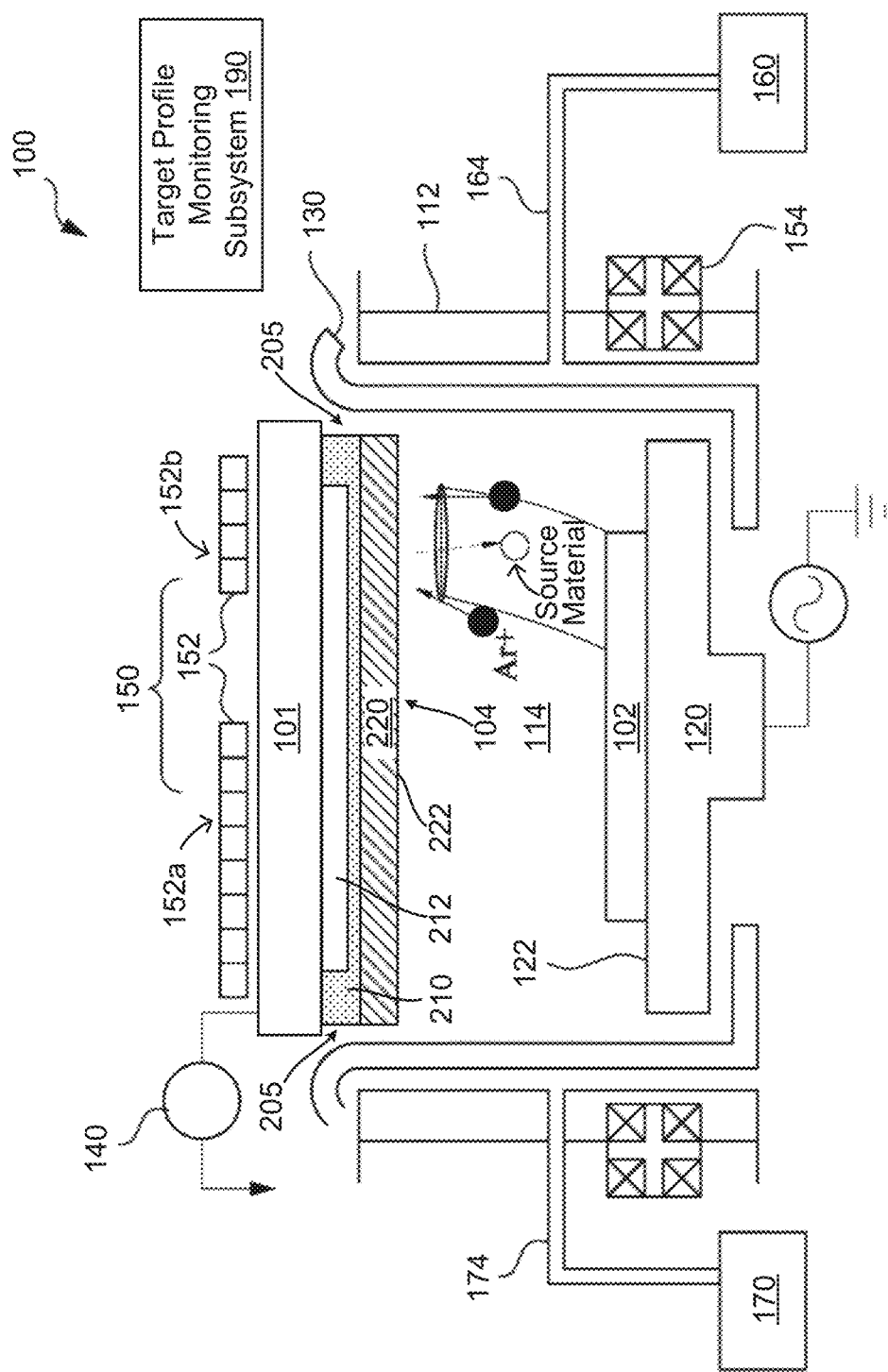
FIG. 1 is a schematic diagram illustrating an example PVD system in accordance with some embodiments.

The following disclosure provides many different embodiments, or examples, for implementing different features of the subject matter provided. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In addition, source/drain region(s) may refer to a source or a drain, individually or collectively dependent upon the context. For example, a device may include a first source/drain region and a second source/drain region, among other components. The first source/drain region may be a source region, whereas the second source/drain region may be a drain region, or vice versa. One of ordinary skill in the art would recognize many variations, modifications, and alternatives.

Some embodiments of the disclosure are described. Additional operations can be provided before, during, and/or after the stages described in these embodiments. Some of the stages that are described can be replaced or eliminated for different embodiments. Some of the features described below can be replaced or eliminated and additional features can be added for different embodiments. Although some embodiments are discussed with operations performed in a particular order, these operations may be performed in another logical order.

Overview

Physical vapor deposition (PVD) is a common process for depositing a film of material on a substrate and is commonly used in semiconductor fabrication. The PVD process is carried out at a high vacuum in a chamber containing a substrate (e.g., a wafer) and a solid source or slab of the material (i.e., a "PVD target" or a "target") to be deposited on the substrate. In the PVD process, the PVD target is physically converted from a solid into a vapor. The vapor of the target material is transported from the PVD target to the substrate, where it is condensed on the substrate as a film.

There are many methods for accomplishing PVD, including evaporation, e-beam evaporation, plasma spray deposition, and sputtering. Among those methods, sputtering is usually the most frequently used method for accomplishing PVD. During sputtering, gas plasma is created in the chamber and directed to the PVD target. The plasma physically dislodges or erodes (sputters) atoms or molecules from the reaction surface of the PVD target into a vapor of the target material, as a result of a collision with high-energy particles (e.g., ions) of the plasma. The vapor of sputtered atoms or molecules of the target material is transported to the substrate through a region of reduced pressure and condenses on the substrate, forming the film of the target material.

A PVD target typically includes a backing plate and a target plate. The backing plate is attached to the target plate and made of a conductive material. A power supply is electrically coupled to the backing plate so that the target plate is, for example, negatively biased with respect to a chamber body of the PVD system. The target plate is typically made of the target material with high purity (e.g., 99.999%). As a result, the target plate and, therefore, the PVD target could be very expensive for certain target materials, such as ruthenium (Ru), Iridium (Ir), and tantalum (Ta). By way of example, the price of a PVD target of certain target materials may be hundreds of thousands of U.S. dollars. Accordingly, the usage of the target plate is critical to the cost-effectiveness of a PVD system.

However, due to the magnetic fields in the chamber used to increase the plasma density, ions in the plasma have different energy levels. Some ions are highly energized, while other ions are less energized. As a result, the target plate is usually characterized by an uneven erosion profile. In other words, the target plate is consumed more at some locations than at other locations. For example, the target plate may erode (i.e., may be consumed) more at the periphery than at the center of the target plate. This can be reflected in a cross-sectional profile, which is called the erosion profile, of the target plate after the target plate has been used (i.e., the target material has been consumed) for a while.

The uneven erosion profile will result in poor usage of the target plate. Due to the uneven erosion profile, the remaining target plate has a smaller thickness at some locations than at other locations. The remaining thickness of the target plate at any location has to be maintained above a certain threshold (e.g., two millimeters). If the remaining thickness of the target plate at any location accidentally becomes zero, the backing plate is exposed to ion bombardment. The backing plate is usually made of a material different from that of the target plate. As a result, the film formed on the wafer does not have the desired composition, leading to the fabrication failure of the entire wafer. Moreover, the chamber of the PVD system is contaminated with the material of the backing plate, resulting in a costly recovery process to be implemented. On the other hand, if the remaining thickness of the target plate is unnecessarily large or larger than enough, the overall usage of the target plate is reduced, thereby increasing the fabrication cost.

In addition, the uneven erosion profile of the target plate may result in poor uniformity of the deposited film and uneven film characteristics across the wafer. For example, poor step coverage may be achieved at some locations of the wafer while good step coverage may be achieved at other locations of the wafer.

In accordance with some aspects of the disclosure, a PVD system with target erosion profile monitoring is provided. The PVD system includes, among other components, a chamber body, a substrate support disposed within the chamber body and capable of supporting a substrate, a PVD target, and a target profile monitoring subsystem. The PVD target includes a target plate made of a target material and a backing plate attached to the target plate. The backing plate includes a central section and a peripheral section circumferentially surrounding the central section in a horizontal plane. The peripheral section has a first thickness in a vertical direction, the central section has a second thickness in the vertical direction, and the first thickness is larger than the second thickness. In other words, a recess is created in the backing plate. The target profile monitoring subsystem is configured to monitor the usage of the target plate.

The erosion profile discussed above contributes to a bending force that tends to bend the periphery of the backing plate (and, therefore, the target plate) upward. Unlike a conventional PVD target, where the bending force is generally not large enough to result in noticeable bending of the backing plate, the recess results in reduced surface stress, thereby contributing to a larger bending force. The bending of the backing plate can be monitored by the target profile monitoring subsystem in real-time. Accordingly, the target plate can be utilized to a fuller extent, thereby increasing the usage of the target plate.

Example PVD System with Target Erosion Profile Monitoring

FIG. 1 is a schematic diagram illustrating an example PVD system 100 in accordance with some embodiments. The PVD system 100 is capable of depositing a film onto a substrate 102 using a PVD target 104. During the PVD process, the PVD target 104 is bombarded by energetic ions, such as plasma, causing material to be knocked off the PVD target 104 and deposited as a film on the substrate 102. As will be discussed in greater detail below with reference to FIG. 8, the PVD system 100 includes a target erosion profile monitoring subsystem 190, which is configured to monitor the usage of the PVD target 104 dynamically. As a result, the remaining thickness of the target plate 220 decreases as compared to a conventional PVD system, thereby increasing the usage of the target plate 220. In one example, the minimum remaining thickness (the minimum value that is acceptable) of the target plate 220 can be 0.5 mm for a target plate 220 with a thickness of 10 mm. In contrast, the minimum remaining thickness of a conventional target plate with a thickness of 10 mm is 2 mm. The minimum remaining thickness decreases by 75%.

In some embodiments, the PVD system 100 is a magnetron PVD system including a chamber body 112, which encloses a processing region or a plasma zone 114. A substrate support 120 is disposed within the chamber body 112. The substrate support 120 has a substrate receiving surface 122 that receives and supports the substrate 102 during the PVD process, so that a surface of the substrate 102 is opposite to the front surface 222 of the PVD target 104 that is exposed to the processing region 114. The PVD target 104 is disposed on a lid 101, details of which will be discussed below with reference to FIG. 2. The substrate support 120 is electrically conductive and is coupled to ground (GND) so as to define an electrical field between the PVD target 104 and the substrate 102. In some embodiments, the substrate support 120 is composed of aluminum, stainless steel, or ceramic material. In some embodiments, the substrate support 120 is an electrostatic chuck that includes a dielectric material.

A shield 130, also referred to as a "dark space shield," is positioned inside the chamber body 112 and proximate sidewalls 205 of the PVD target 104 to protect inner surfaces of the chamber body 112 and sidewalls 205 of the PVD target 104 from unintended deposition. The shield 130 is positioned very close to the sidewalls 205 to minimize re-sputtered material from being deposited thereon. The shield 130 has a plurality of apertures (not shown) defined therethrough for admitting a plasma-forming gas such as argon (Ar) from the exterior of the shield 130 into its interior.

A power supply 140 is electrically coupled to the backing plate 210 of the PVD target 104 through the lid 101. The backing plate 210 is attached to the target plate 220, which contains the intended source material (also referred to as the "target material") of the PVD target 104. In the example shown in FIG. 1, the backing plate 210 has a recess 212, details of which will be discussed below. The power supply 140 is configured to negatively bias the PVD target 104 with respect to the chamber body 112 to excite a plasma-forming gas, for example, argon (Ar), into a plasma. In some embodiments, the power supply 140 is a direct current (DC) power supply source. It should be understood that the power supply 140 may also be, for example, a radio frequency (RF) power supply source in other embodiments.

A magnet assembly 150 is disposed above the PVD target 104. The magnet assembly 150 is configured to project a magnetic field parallel to the front surface 222 of the PVD target 104 to trap electrons, thereby increasing the density of the plasma and increasing the sputtering rate. In some embodiments, the magnet assembly 150 is configured to scan about the back of the PVD target 104 to improve the uniformity of deposition. In some embodiments, the magnet assembly 150 includes a single magnet disposed above the PVD target 104. In some embodiments, the magnet assembly 150 includes an array of magnets. In some embodiments and as shown in FIG. 1, the magnet assembly 150 also includes a side electromagnet 154 around the chamber body 112.

In the example shown in FIG. 1, the magnet assembly 150 includes a pair of back magnets 152 disposed above the PVD target 104. The relatively larger magnet 152a is configured for the cleaning of the chamber of the PVD system 100, while the relatively small magnet 152b is configured for increasing the density of the plasma and increasing the sputtering rate. The relatively large magnet 152a and the relatively small magnet 152b are capable of scanning about the back of the PVD target 104. The geometries of the relatively large magnet 152a and the relatively small magnet 152b contribute to the erosion profile of the target plate 220.

A gas source 160 is in fluidic combination with the chamber body 112 via a gas supply pipe 164. The gas source 160 is configured to supply a plasma-forming gas to the process region 114 via the gas supply pipe. The plasm-forming gas is an inert gas and does not react with the materials in the PVD target 104. In some embodiments, the plasma-forming gas includes argon (Ar), xenon (Xe), neon (Ne), or helium (He), which is capable of energetically impinging upon and sputtering source material (and the dopant in some embodiments) from the PVD target 104. In some embodiments, the gas source 160 is also configured to supply a reactive gas into the PVD system 100. The reactive gas includes one or more of an oxygen-containing gas, a nitrogen-containing gas, a methane-containing gas, that is capable of reacting with the sputtering source material in the PVD target 104 to form a layer on the substrate 102.

A vacuum device 170 is in fluidic communication with the PVD system 100 via an exhaust pipe 174. The vacuum device 170 is used to create a vacuum environment in the PVD system 100 during the PVD process. In some embodiments, the PVD system 100 has a pressure in a range from about 1 mTorr to about 10 Torr. The spent process gases and byproducts are exhausted from the PVD system 100 through the exhaust pipe 174.

Example PVD Target with a Recess in the Backing Plate

Figure 2:
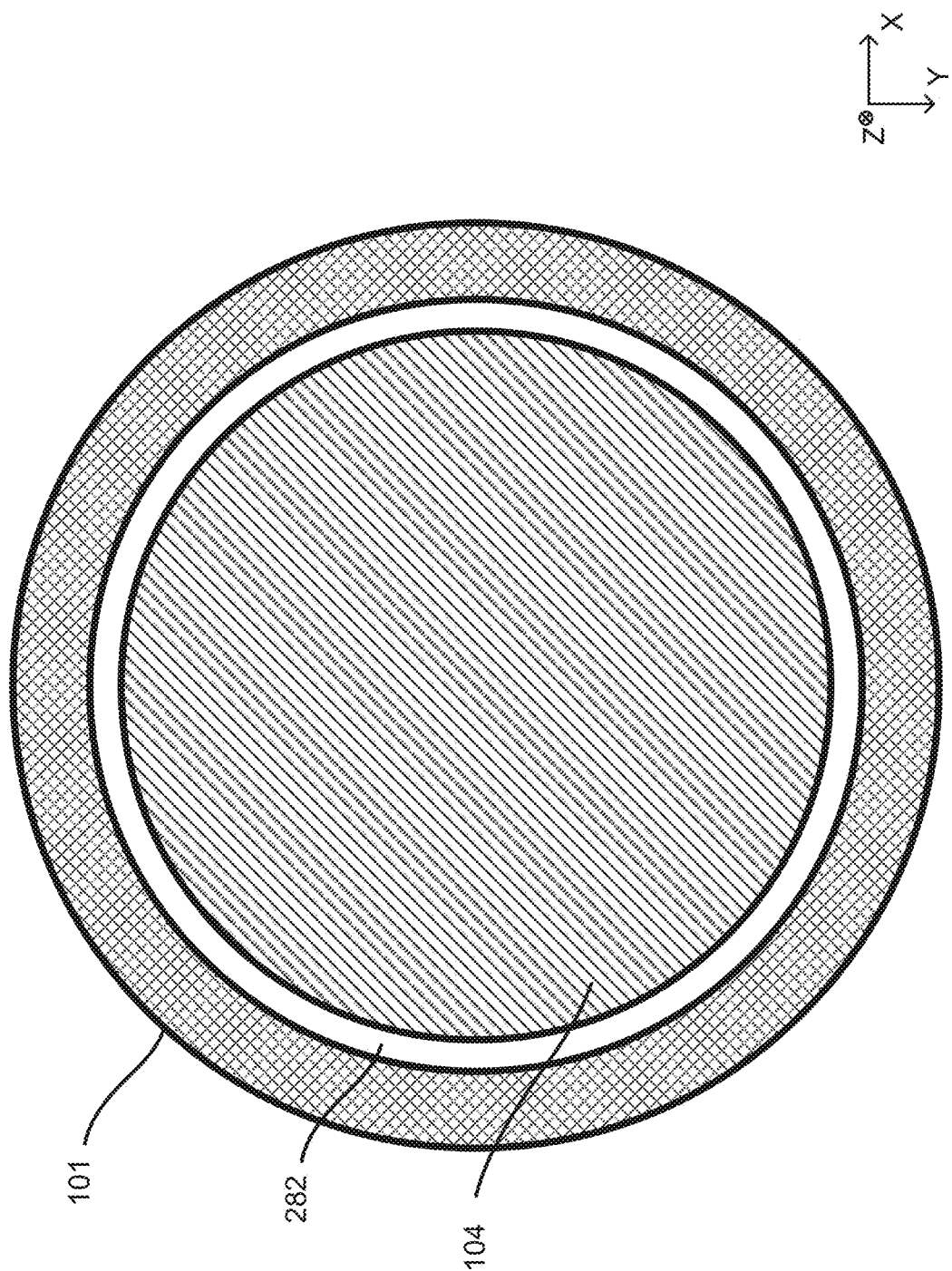
FIG. 2 is a bottom view of an example lid in accordance with some embodiments.
Figure 3:
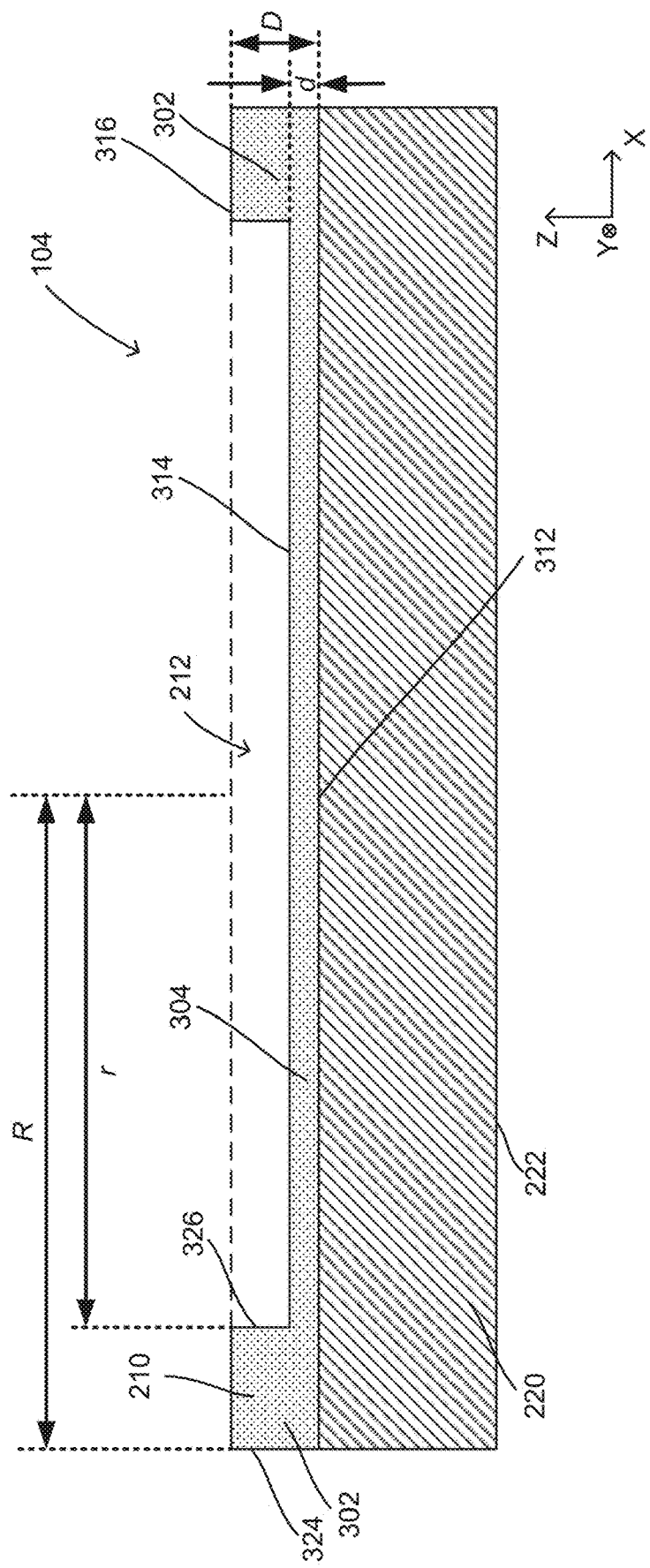
FIG. 3 is a cross-sectional view of an example PVD target in accordance with some embodiments.
Figure 4:
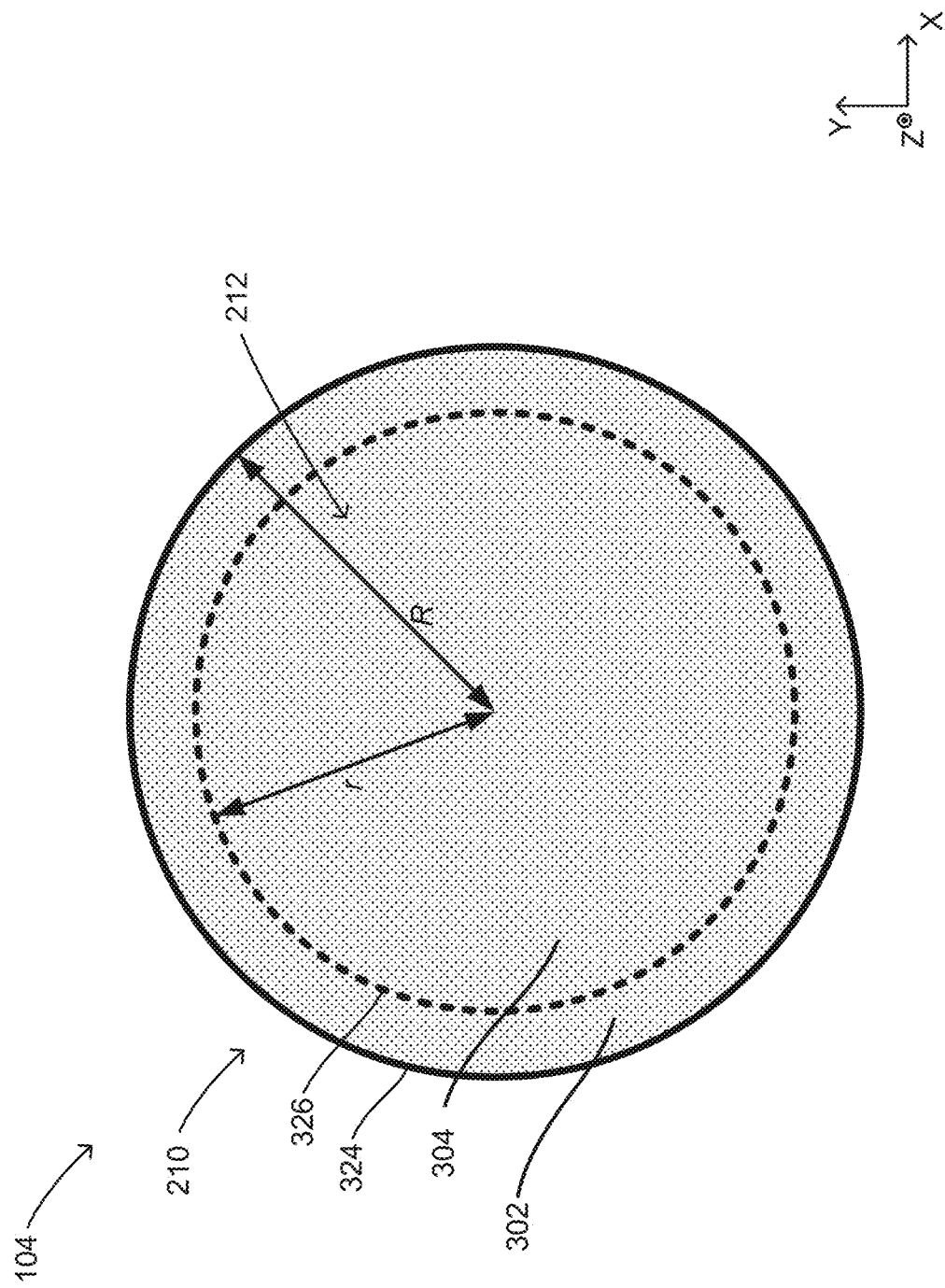
FIG. 4 is a top view of the example PVD target shown in FIG. 3 in accordance with some embodiments.

FIG. 2 is a bottom view of an example lid 101 in accordance with some embodiments. FIG. 3 is a cross-sectional view of an example PVD target 104 in accordance with some embodiments. FIG. 4 is a top view of the example PVD target 104 shown in FIG. 3 in accordance with some embodiments.

In the example shown in FIG. 2, the lid 101 has a circular shape in the horizontal plane (i.e., the X-Y plane shown in FIG. 2). A cavity 282 is located at the bottom of the lid 101. The cavity 282 is used to accommodate the PVD target 104. In the example shown in FIG. 2, the cavity 282 and the PVD target 104 are concentric. The cavity 282 has a larger cross section in the X-Y plane than the PVD target 104. In other words, there is some clearance between the PVD target 1-4 and the lid 101. It should be understood that the geometries of the lid 101 and the PVD target 104 are exemplary rather than limiting, and other geometries of the lid 101 and the PVD target 104 may be employed in other embodiments.

In some embodiments, the PVD target 104 is covered by a shutter, which can be controlled to cover or expose the PVD target 104. As such, the PVD target 104 can be protected when the PVD system 100 is not operating.

Now referring to FIG. 3, the PVD target 104 includes the target plate 220 and the backing plate 210. The target plate 220 is located under the backing plate 210 in the vertical direction (i.e., the Z-direction shown in FIG. 3). The target plate 220 is attached to or coupled to the backing plate 210 at an interface 312, which is also the top surface of the target plate 220 and the bottom surface of the backing plate 210.

Unlike a conventional backing plate, which has a uniform thickness in the vertical direction (i.e., the Z-direction shown in FIG. 3), the backing plate 210 includes a peripheral section 302 having a first thickness (labeled as "D" as shown in FIG. 3) and a central section 304 having a second thickness (labeled as "d" as shown in FIG. 3), thereby defining a recess 212 having a depth, in the Z-direction, defined by the distance between a top surface 314 of the central section 304 and a top surface 316 of the peripheral section 302. The depth of the recess 212 is also the difference between the first thickness and the second thickness (i.e., D-d). The first thickness is larger than the second thickness. In one example, the first thickness is 5 mm, and the second thickness is 3 mm, and the depth of the recess 212 is 2 mm. The peripheral section 302 is located at the periphery of the backing plate 210 in the horizontal plane (i.e., the X-Y plane shown in FIG. 3), while the central section 304 is located at the center of the backing plate 210 in the X-Y plane. The peripheral section 302 circumferentially surrounds the central section 304.

In one embodiment and as shown in FIG. 4, the backing plate 210 has a circular shape, and the central section 304, the peripheral section 302, and the backing plate 210 are concentric. The central section 304 has a circular cross section in the X-Y plane. The peripheral section 302 has a ring-shaped cross section in the X-Y plane. The peripheral section is defined by an inner sidewall 326 and an outer sidewall 324, both of which are cylindrical surfaces. The backing plate 210 has a first radius (labeled as "R" as shown in FIGS. 3-4), and the central section 304 has a second radius (labeled as "r" as shown in FIGS. 3-4). The width of the peripheral section 302 in the radial direction, the distance between the inner sidewall 326 and the outer sidewall 324, is the difference between the first radius and the second radius (i.e., R-r). In one example, the first radius is 222 mm. The recess 212 is defined by the inner sidewall 326, the top surface 314 of the central section 304 and the top surface 316 of the peripheral section 302.

Figure 5:
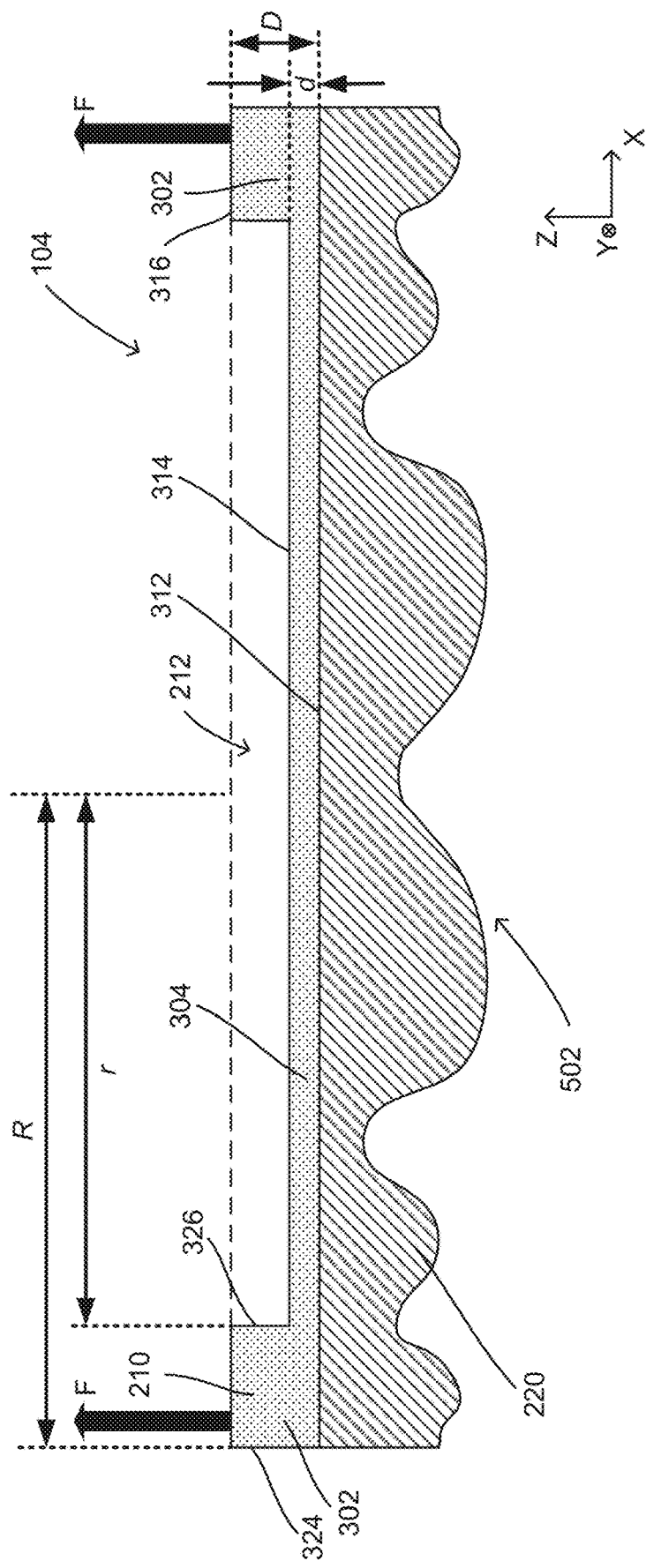
FIG. 5 is a cross-sectional view of the PVD target 104 shown in FIG. 3 after usage in accordance with some embodiments.

FIG. 5 is a cross-sectional view of the PVD target 104 shown in FIG. 3 after usage in accordance with some embodiments. Similar aspects of the PVD target 104 will not be repeated since they have been discussed with reference to FIG. 3. As discussed above, an uneven erosion profile 502 is formed at the bottom of the target plate 220. The target plate 220 is consumed more at some locations than at other locations after it has been used for a while. In the example shown in FIG. 5, the target plate 220 is consumed more at the periphery than at the center of the target plate 220. The erosion profile 502 contributes to a bending force that tends to bend the periphery of the backing plate 210 (and, therefore, the target plate 220) upward. However, the bending force, for a conventional PVD target, is generally not large enough to result in noticeable bending of the target plate and the backing plate of the conventional PVD target because the backing plate is rigid and can withstand the bending force.

In contrast, the backing plate 210 shown in FIG. 5 has the recess 212. It is known that the surface stress of a disk-like structure can be calculated by $$\sigma = \frac{Et^2}{6R_a},$$

where σ is the surface stress, $R_a$ is the radius, E is the Young's modulus of the material of the disk-like structure, and t is the thickness of the disk-like structure. Since the thickness of the central section 304 becomes smaller than the thickness of the peripheral section 302, the surface stress at the central section 304 decreases accordingly. The change in the surface stress along with the erosion profile 502 contribute to the bending force (denoted as arrows and labeled as "F" as shown in FIG. 5). The bending force becomes large enough so that the bending force bends the periphery of the backing plate 210 upward.

Figure 6:
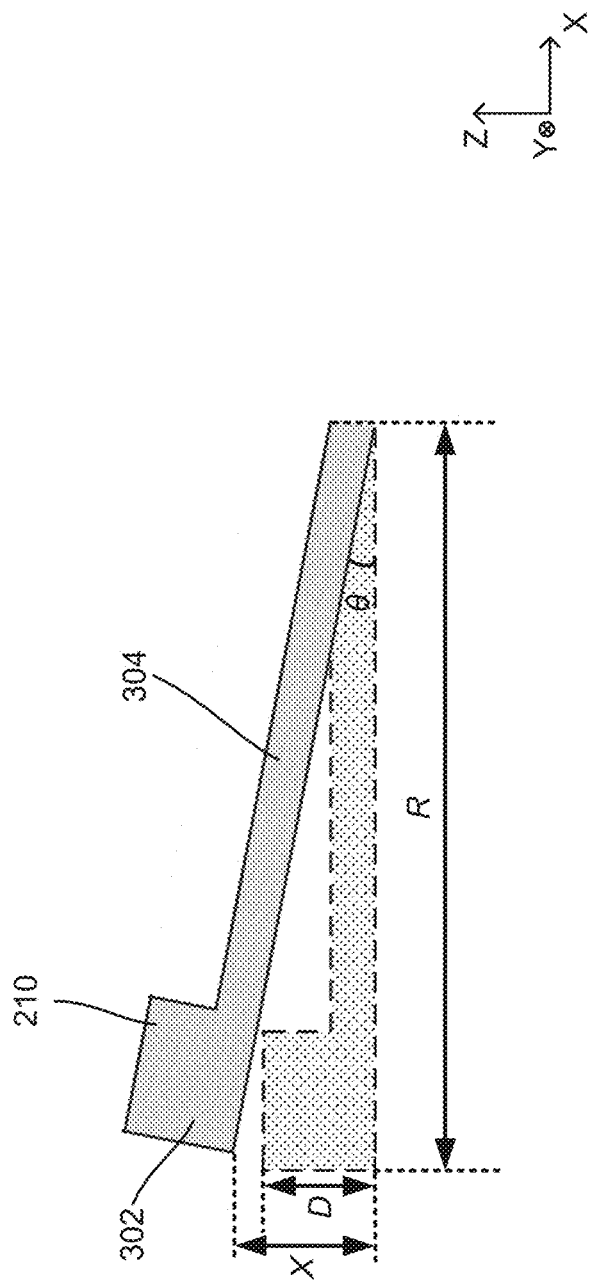
FIG. 6 is a diagram schematically illustrating the bending of the backing plate in accordance with some embodiments.

FIG. 6 is a diagram schematically illustrating the bending of the backing plate 210 in accordance with some embodiments. Although only half of the backing plate 210 is shown in FIG. 6, one of ordinary skill in the art should appreciate that the other half is similar. In the example shown in FIG. 6, the displacement (labeled as "X" as shown in FIG. 6) of the peripheral section 302 in the Z-direction is larger than the first thickness (labeled as "D" as shown in FIG. 6). As discussed above, the backing plate 210 has a first radius (labeled as "R" as shown in FIG. 6). Therefore, the bending angle (labeled as "θ" as shown in FIG. 6) can be calculated according to $$\theta = \tan^{-1}\frac{X}{R}.$$

In one example, R is 222 mm, X is larger than 5 mm. Therefore, the bending angle θ is larger than 1.29 degrees. In one example, the bending angle θ is 1.5 degrees. In another example, the bending angle θ is 2 degrees.

Monitoring the Erosion Profile of a PVD Target

Figure 7:
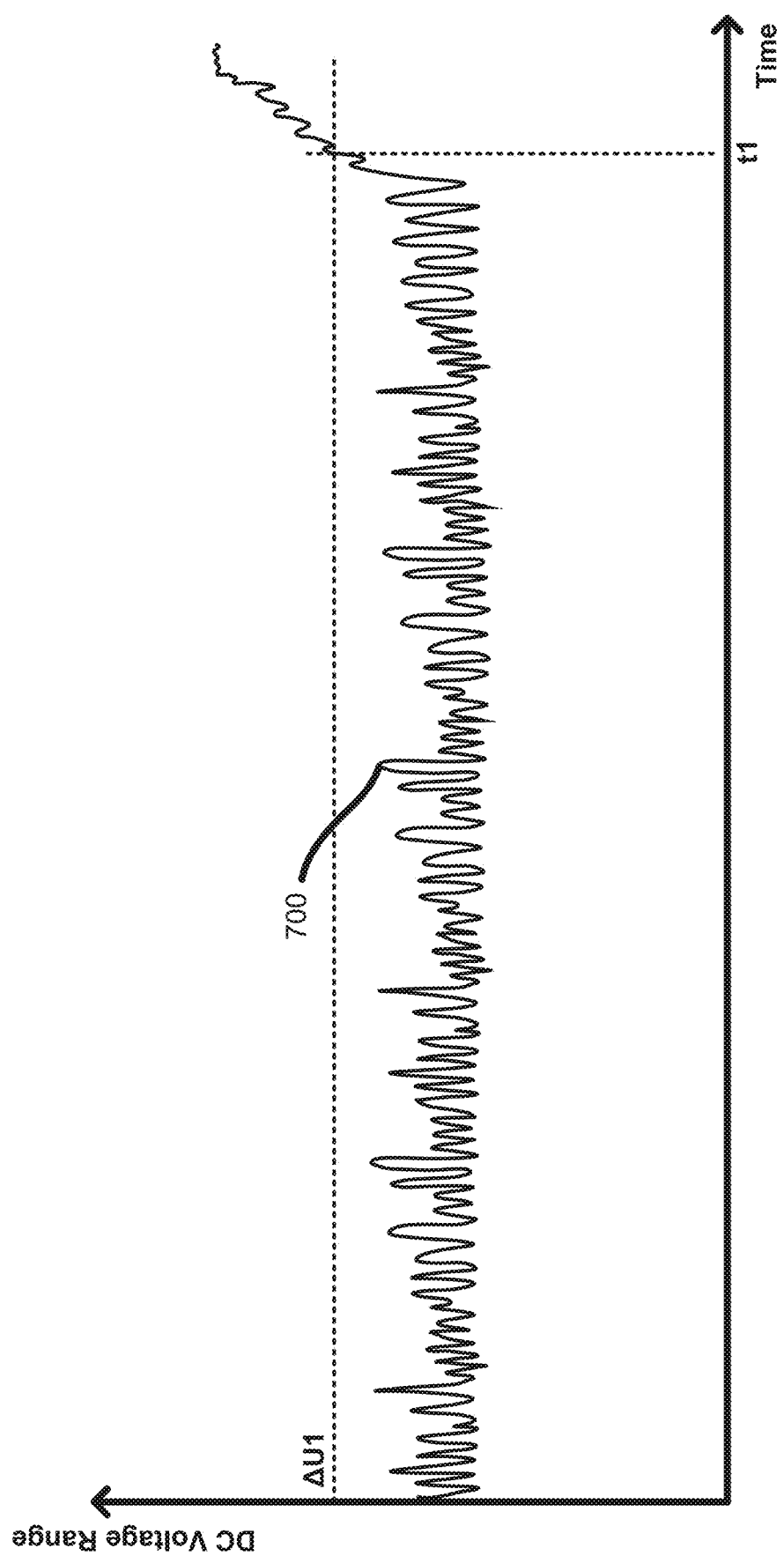
FIG. 7 is a diagram illustrating an example DC voltage range curve in accordance with some embodiments.

FIG. 7 is a diagram illustrating an example DC voltage range curve 700 in accordance with some embodiments. As discussed above, the power supply 140 shown in FIG. 1 provides power to the PVD system 100. The DC power consumption of the system can be calculated in accordance with P=U²/Z, where P is the DC power consumption, U is the DC voltage, and Z is the equivalent impedance of the PVD system 100. The equivalent impedance of the PVD system 100 includes contributions from substrate support 120, the substrate 102, the plasma in the processing region 114, the PVD target 104, the lid 101, and the like.

The DC voltage and the DC power consumption are constantly monitored by the PVD system 100. The variation of the DC voltage in a short time period (e.g., 0.05 second) is calculated, and the variation of the DC voltage (also referred to as the "DC voltage range") varies over time. Therefore, the DC voltage range curve 700 can be obtained.

As discussed above with reference to FIGS. 5-6, due to the existence of the recess 212, the bending force becomes large enough so that the bending force bends the periphery of the backing plate 210 upward. It is observed that when the periphery of the backing plate 210 is bent upward, the variation of the DC voltage rises dramatically. In the example shown in FIG. 7, the DC voltage range fluctuates over time but is lower than a threshold value (denoted as "ΔU1" as shown in FIG. 7) prior to a moment (denoted as "t1" as shown in FIG. 7). However, after the moment t1, the DC voltage range rises above the threshold value. Thus, the rise in the DC voltage range can be used as an indicator of the bending of the backing plate 210. As such, the usage of the target plate 220 can be monitored in real-time.

One explanation for the rise in the DC voltage range is related to the equivalent impedance of the PVD system 100. It is discussed above with reference to FIG. 2 that the cavity 282 is used to accommodate the PVD target, and the cavity 282 has a larger cross section in the X-Y plane than the PVD target 104. However, the clearance between the PVD target 104 and the lid 101 may not be large enough. As a result, when the bending force bends the periphery of the backing plate 210 upward as shown in FIG. 6, the backing plate 210 may be in contact with the lid 101. The change in the equivalent impedance leads to the rise in the DC voltage range.

Example Target Profile Monitoring Subsystem 190

Figure 8:
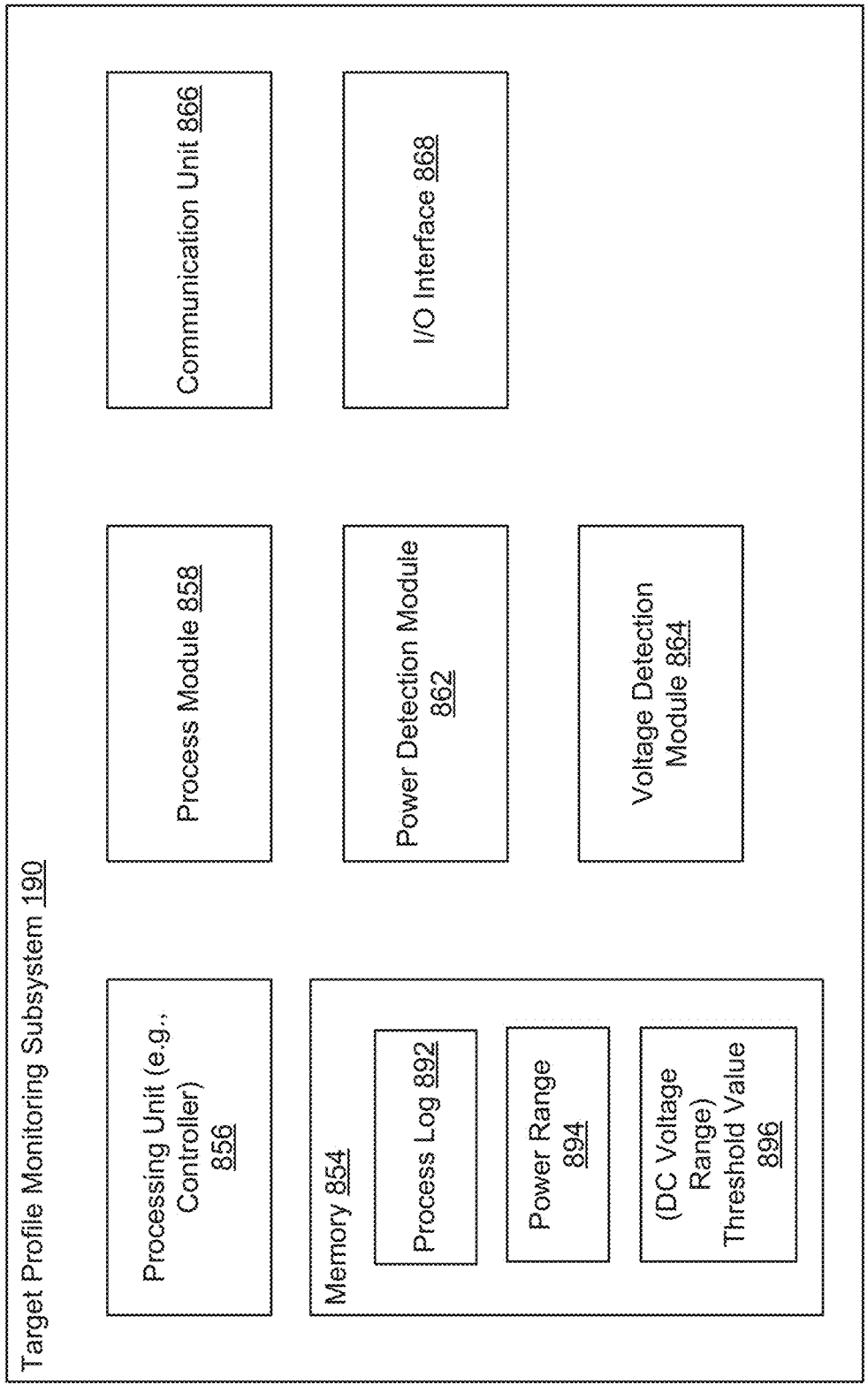
FIG. 8 is a block diagram illustrating an example target profile monitoring subsystem in accordance with some embodiments.

FIG. 8 is a block diagram illustrating an example target profile monitoring subsystem 190 in accordance with some embodiments. In the example shown in FIG. 8, the target profile monitoring subsystem 190 includes, among other things, a processing unit 856, a memory 854, a process module 858, a power detection module 862, a voltage detection module 864, a communication unit 886, and an I/O interface 868.

The processing unit 856 is configured to execute codes or instructions stored in the memory 854 to cause the target profile monitoring subsystem 190 to perform various functions disclosed herein. For example, the processing unit 856 determines whether the DC voltage range curve 700 is above the threshold value, as shown in FIG. 7. In one embodiment, the processing unit 856 is a central processing unit (CPU), a multi-processor, a distributed processing system, an application specific integrated circuit (ASIC), a controller, and/or a suitable processing unit.

The memory 854 is configured to store the codes or instructions that are executed by the target profile monitoring subsystem 190. In addition, the memory 854 also stores the process log 892, the power range 894, and the (DC voltage range) threshold value 896, details of which will be discussed below. In various implementations, the memory 854 may include one or more of a solid-state memory, a magnetic tape, a removable computer diskette, a randomaccess memory (RAM), a read-only memory (ROM), a rigid magnetic disk, an optical disk, and/or a suitable memory device.

The process module 858 is configured to control the PVD process carried out in the PVD system 100. In one implementation, the process module 858 obtains the process log 892 stored in the memory 854 and sends control signals to various components of the PVD system 100 to operate them according to the process log 892. For example, when the processing unit 856 determines that the DC voltage range curve (e.g., the DC voltage range curve 700 shown in FIG. 7) is above the threshold value, the process module 858 is instructed by the processing unit 856 to generate a control signal to stop the PVD system. A technician can then inspect the usage of the PVD target and replace it with a new PVD target.

The power detection module 862 is configured to detect the DC power consumption of the PVD system 100 in real-time. It should be understood that, in other embodiments, the power detection module 862 may be a stand-alone component of the PVD system 100 that communicates with the target profile monitoring subsystem 190 via the communication unit 866.

The voltage detection module 864 is configured to detect the DC voltage of the PVD system 100 in real-time. It should be understood that, in other embodiments, the voltage detection module 864 may be a stand-alone component of the PVD system 100 that communicates with the target profile monitoring subsystem 190 via the communication unit 866. The voltage detection module 864 is also configured to obtain the DC voltage range curve (e.g., the DC voltage range curve 700 shown in FIG. 7) based on the DC voltage of the PVD system 100. In some embodiments, the voltage detection module 864 may utilize the computational power of the processing unit 856.

The communication unit 866 is configured to connect the target profile monitoring subsystem 190 to other components of the PVD system 100 or other units outside the PVD system 100 via one or more communication networks, such as the Internet, other wide area networks, local area networks, metropolitan area networks, VPNs, and the like. The I/O interface 868 provides interfaces to couple external input and output devices to the target profile monitoring subsystem 190.

Example Method for Monitoring the Erosion Profile of a PVD Target

Based on the principles discussed above, a method for monitoring the erosion profile of a PVD target is provided. FIG. 9 is a flowchart illustrating an example method for monitoring the erosion profile of a PVD target. In the example shown in FIG. 9, the method 900 includes operations 902, 904, 906, and 908. Additional operations may be performed. Also, it should be understood that the sequence of the various operations discussed above with reference to FIG. 9 is provided for illustrative purposes, and as such, other embodiments may utilize different sequences. These various sequences of operations are to be included within the scope of embodiments.

At operation 902, a PVD target (e.g., the PVD target 104 shown in FIG. 3) is introduced in a PVD system (e.g., the PVD system 100 shown in FIG. 1). The PVD target includes a target plate (e.g., the target plate 220 shown in FIG. 3) comprising a target material and a backing plate (e.g., the backing plate 210 shown in FIG. 3) attached to the target plate. The backing plate includes a central section (e.g., the central section 304 shown in FIG. 3) and a peripheral section (e.g., the peripheral section 302 shown in FIG. 3) circumferentially surrounding the central section in a horizontal plane. The peripheral section has a first thickness in a vertical direction, and the central section has a second thickness in the vertical direction. The first thickness is larger than the second thickness.

In one implementation, the PVD target can be obtained by retrofitting a conventional PVD target (also referred to as "an initial PVD target"). The initial PVD target includes the target plate and an initial backing plate, which has a flat top surface and a flat bottom surface. A recess (e.g., a recess 212 shown in FIG. 3) is then created in the initial backing place to form the backing plate (e.g., the backing plate 210 shown in FIG. 3).

At operation 904, the target material is deposited on a substrate (e.g., the substrate 102 shown in FIG. 1). A film of the target material is formed on the substrate.

At operation 906, usage of the target plate is monitored. The monitoring is in real-time so that the target plate can be used to a fuller extent as compared to a target plate of a conventional PVD target.

In one implementation, operation 906 may include operations 912, 914, and 916. At operation 912, a DC voltage of the PVD system is detected. The DC voltage of the PVD system may be detected by a voltage detection module (e.g., the voltage detection module 864 shown in FIG. 8). At operation 914, a DC voltage range curve (e.g., the DC voltage range curve 700 shown in FIG. 7) is obtained based on the DC voltage of the PVD system. At operation 916, it is determined whether the DC voltage range curve is above a threshold value (e.g., the threshold value shown in FIG. 7).

At operation 908, the PVD system is stopped after determining that the DC voltage range curve is above the threshold value. When the DC voltage range curve is above the threshold value, indicating that the peripheral section of the backing plate bends upward, the PVD system is stopped to prevent the target plate from being overused to expose the backing plate.

It should be understood that the method 900 may include additional operations. For example, after the PVD system is stopped, a notification may be sent to a technician, and the PVD target may be inspected by the technician to evaluate whether it is a good time to replace the PVD target with a new PVD target.

Summary

In accordance with some aspects of the disclosure, a PVD system is provided. The PVD system includes: a chamber body; a substrate support disposed within the chamber body and capable of supporting a substrate; a PVD target; and a target profile monitoring subsystem. The PVD target includes: a target plate comprising a target material; and a backing plate attached to the target plate and comprising: a central section; and a peripheral section circumferentially surrounding the central section in a horizontal plane. The peripheral section has a first thickness in a vertical direction, the central section has a second thickness in the vertical direction, and the first thickness is larger than the second thickness. The target profile monitoring subsystem is configured to monitor usage of the target plate.

In accordance with some aspects of the disclosure, a method is provided. The method includes: introducing a physical vapor deposition (PVD) target in a PVD system, the PVD target comprising a target plate comprising a target material and a backing plate attached to the target plate, the backing plate comprising a central section and a peripheral section circumferentially surrounding the central section in a horizontal plane, wherein the peripheral section has a first thickness in a vertical direction, the central section has a second thickness in the vertical direction, and the first thickness is larger than the second thickness; depositing the target material on a substrate; and monitoring usage of the target plate.

In accordance with some aspects of the disclosure, a PVD target is provided. The PVD target includes: a target plate comprising a target material; and a backing plate attached to the target plate and comprising: a central section; and a peripheral section circumferentially surrounding the central section in a horizontal plane. The peripheral section has a first thickness in a vertical direction, the central section has a second thickness in the vertical direction, and the first thickness is larger than the second thickness.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A physical vapor deposition (PVD) system comprising:
a chamber body;
a substrate support disposed within the chamber body and capable of supporting a substrate;
a PVD target comprising:
a target plate comprising a target material, wherein the target plate having a flat top surface; and
a backing plate comprising:
a central section;
a peripheral section circumferentially surrounding the central section in a horizontal plane, wherein the peripheral section has a first thickness in a vertical direction, the central section has a second thickness in the vertical direction, and the first thickness is larger than the second thickness, and wherein the peripheral section of the backing plate bends upward after the target material is consumed; and
a flat bottom surface, wherein the flat bottom surface of the backing plate is attached to the flat top surface of the target plate, defining a flat interface between the backing plate and the target plate; and
a target profile monitoring subsystem configured to monitor usage of the target plate.

2. The PVD system of claim 1, wherein the central section has a circular cross section in the horizontal plane.

3. The PVD system of claim 2, wherein the peripheral section has a ring-shaped cross section in the horizontal plane.

4. The PVD system of claim 3, wherein the peripheral section and the central section are concentric.

5. The PVD system of claim 4, wherein the peripheral section has an inner sidewall and an outer sidewall.

6. The PVD system of claim 5, wherein a recess is defined by the inner sidewall of the peripheral section, a top surface of the central section, and a top surface of the peripheral section.

7. The PVD system of claim 1, wherein the target profile monitoring subsystem comprises a voltage detection module configured to:
detect a direct current (DC) voltage of the PVD system; and
obtain a DC voltage range curve based on the DC voltage of the PVD system.

8. The PVD system of claim 7, wherein the target profile monitoring subsystem further comprises a processing unit configured to determine whether the DC voltage range curve is above a threshold value.

9. The PVD system of claim 8, wherein the target profile monitoring subsystem further comprises a process module configured to generate a control signal to stop the PVD system after the processing unit determines that the DC voltage range curve is above the threshold value.

10. The PVD system of claim 1, wherein a displacement of the peripheral section is larger than the first thickness.

11. A method comprising:
introducing a physical vapor deposition (PVD) target in a PVD system, the PVD target comprising:
a target plate comprising a target material, wherein the target plate having a flat top surface; and
a backing plate comprising:
a central section;
a peripheral section circumferentially surrounding the central section in a horizontal plane, wherein the peripheral section has a first thickness in a vertical direction, the central section has a second thickness in the vertical direction, and the first thickness is larger than the second thickness, and wherein the peripheral section of the backing plate bends upward after the target material is consumed; and
a flat bottom surface, wherein the flat bottom surface of the backing plate is attached to the flat top surface of the target plate, defining a flat interface between the backing plate and the target plate; and
depositing the target material on a substrate; and
monitoring usage of the target plate.

12. The method of claim 11, wherein the introducing the PVD target comprises:
providing an initial PVD target comprising the target plate and an initial backing plate; and
creating a recess in the initial backing plate to form the backing plate.

13. The method of claim 11, wherein the monitoring the usage of the target plate comprises:
detecting a direct current (DC) voltage of the PVD system;
obtaining a DC voltage range curve based on the DC voltage of the PVD system; and
determining whether the DC voltage range curve is above a threshold value.

14. The method of claim 11, wherein the monitoring the usage of the target plate further comprises:
detecting a DC power consumption of the PVD system.

15. The method of claim 13, further comprising:
stopping the PVD system after the DC voltage range curve is determined to be above the threshold value.

16. A physical vapor deposition (PVD) target comprising:
a target plate comprising a target material, wherein the target plate having a flat top surface; and
a backing plate comprising:
a central section;
a peripheral section circumferentially surrounding the central section in a horizontal plane, wherein the peripheral section has a first thickness in a vertical direction, the central section has a second thickness in the vertical direction, and the first thickness is larger than the second thickness, and wherein the peripheral section of the backing plate bends upward after the target material is consumed; and a flat bottom surface, wherein the flat bottom surface of the backing plate is attached to the flat top surface of the target plate, defining a flat interface between the backing plate and the target plate.

17. The PVD target of claim 16, wherein the first thickness is 5 mm, and the second thickness is 3 mm.

18. The PVD target of claim 16, wherein the central section has a circular cross section in the horizontal plane, and the peripheral section has a ring-shape cross section in the horizontal plane.

19. The PVD target of claim 16, wherein a displacement of the backing plate in the vertical direction is larger than the first thickness.

20. The PVD target of claim 18, wherein the peripheral section and the central section are concentric.

\* \* \* \* \*